(12) United States Patent
Fu (10) Patent No.: US 9,312,882 B2
(45) Date of Patent: Apr. 12, 2016

(54) METHOD AND DEVICE FOR STORING AND DECODING HYBRID AUTOMATIC REPEAT REQUEST TRANSMISSION BLOCK

(71) Applicant: MStar Semiconductor, Inc., Hsinchu Hsien (TW)

(72) Inventor: Yong-Sheng Fu, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 301 days.

(21) Appl. No.: 13/950,712

(22) Filed: Jul. 25, 2013

(65) Prior Publication Data
US 2014/0032991 A1    Jan. 30, 2014

(30) Foreign Application Priority Data

Jul. 27, 2012 (CN) .................... 2012 2 0370164 U (51) Int. Cl.
*H04L 1/18* (2006.01)
*H03M 13/05* (2006.01)
*H03M 13/00* (2006.01)

(52) U.S. Cl.
CPC .......... *H03M 13/05* (2013.01); *H03M 13/6306* (2013.01); *H04L 1/18* (2013.01); *H04L 1/1845* (2013.01)

(58) Field of Classification Search
CPC ... H04L 1/1809; H04L 1/1812; H04L 1/1887; H04L 1/1819; H04L 1/1845; H04L 1/0071; H04L 1/0009; H04L 2001/0093
USPC .......................................... 714/746, 748, 751
See application file for complete search history.

(56) References Cited

U.S. PATENT DOCUMENTS

| | | | | |
|---|---|---|---|---|
| 8,312,337 B2* | 11/2012 | Park ...................... | H04L 1/0001 | 714/748 |
| 8,433,878 B1* | 4/2013 | Kotecha .............. | H04L 12/6418 | 370/328 |
| 8,443,248 B2* | 5/2013 | Eckert ................... | H04L 1/1812 | 714/749 |
| 8,583,976 B2* | 11/2013 | Tao ........................ | H04L 1/1835 | 714/748 |
| 8,595,605 B2* | 11/2013 | Wilborn ............ | H03M 13/6525 | 714/794 |
| 8,855,624 B2* | 10/2014 | Gerstenberger .............. | 370/469 | |
| 8,982,807 B2* | 3/2015 | Kim ....................... | H04L 1/1864 | 370/329 |
| 2009/0086657 A1* | 4/2009 | Alpert ................... | H04L 1/1838 | 370/310 |
| 2009/0249150 A1* | 10/2009 | Grovlen ................ | H04L 1/1835 | 714/748 |
| 2011/0276852 A1* | 11/2011 | Mueller-Weinfurtner | H04L 1/1812 | 714/749 |
| 2012/0087396 A1* | 4/2012 | Nimbalker ............ | H04L 1/1822 | 375/219 |
| 2012/0236910 A1* | 9/2012 | Mikami ................ | H04L 1/1829 | 375/219 |
| 2013/0176981 A1* | 7/2013 | Earnshaw ................ | H04L 1/02 | 370/329 |

FOREIGN PATENT DOCUMENTS

| EP | 1482670 | 12/2004 |
|---|---|---|
| TW | 201230717 | 7/2012 |

OTHER PUBLICATIONS

Taiwan Patent Office, "Office Action", Feb. 11, 2014.

* cited by examiner

*Primary Examiner* — Albert Decady
*Assistant Examiner* — Osman M Alshack
(74) *Attorney, Agent, or Firm* — WPAT, PC; Justin King (57) ABSTRACT

A method and a device for storing and decoding a hybrid automatic repeat request (HARQ) transmission block are provided. The method includes obtaining an HARQ transmission block including at least one block during a downlink signal transmission, and storing the code block that cannot be correctly decoded to a divided storage space of a buffer. The storage space of the buffer is dynamically divided in a unit of code blocks.

25 Claims, 9 Drawing Sheets

METHOD AND DEVICE FOR STORING AND DECODING HYBRID AUTOMATIC REPEAT REQUEST TRANSMISSION BLOCK

This application claims the benefit of People's Republic of China application Serial No. 201220370164.X, filed Jul. 27, 2012, the subject matter of which is incorporated herein by reference.

BACKGROUND OF THE INVENTION

1. Field of the Invention

The invention relates in general to a wireless communication technique, and more particularly to a method and a device for storing and decoding a hybrid automatic repeat request (HARQ) transmission block.

2. Description of the Related Art

In a communication system, a cyclic redundancy check (CRC) is usually performed at a reception end to check whether received data is intact and correct. The transmission end then needs to re-transmit the data if the received data is erroneous. To maintain or further enhance reception performance, instead of discarding previous data blocks containing decoding errors, the reception end usually stores soft information of the data blocks so that the previous data blocks can be readily combined with the re-transmitted data blocks.

However, a memory is required for storing the soft information of the previous data blocks containing decoding errors at the reception end, implying that additional costs are needed. Further, the costs for the memory at the reception end increase as the memory capacity expands. Therefore, there is a need for a solution for reducing memory costs for data re-transmission.

SUMMARY OF THE INVENTION

The invention is directed to a method and a device for storing and decoding a hybrid automatic repeat request (HARQ) transmission block. With the method and device, not only a capacity of a buffer is reduced but also utilization efficiency of the buffer is enhanced.

According to an aspect the present invention, a method for storing an HARQ transmission block is provided. The method comprises steps of: obtaining the HARQ transmission block during a downlink signal transmission, wherein the transmission block comprises at least one code block; and storing the code block of the at least one code block that cannot be correctly decoded to a divided storage space of a buffer, wherein the storage space of the buffer is dynamically divided in a unit of code blocks.

According to another aspect of the present invention, a method for decoding an HARQ transmission block is provided. The method comprises steps of: obtaining the HARQ transmission block during a downlink signal transmission, wherein the transmission block comprises at least one code block; storing the code block in the at least one code block that cannot be correctly decoded to a divided storage space of a buffer, and recording starting addresses of the code block stored the first time and the second time in the storage space of the buffer, wherein the storage space of the buffer is dynamically divided in a unit of code blocks; after obtaining a bit of the code block transmitted the third time, obtaining bits of the code block stored the first time and the second time according to the recorded starting addresses of the code block stored the first time and the second time in the storage space of the buffer; combining the bits of the code block stored the first time and the second time with the bit of the code block transmitted the third time in a pack buffer to decode the code block.

According to another aspect of the present invention, a device for decoding an HARQ transmission block is provided. The device comprises: a first obtaining module, for obtaining the HARQ transmission block during a downlink signal transmission, wherein the transmission block comprises at least one code block; a storage module, for storing the code block of the at least one code block that cannot be decoded into a divided stored space of a buffer, wherein the storage space of the buffer is dynamically divided in a unit of code blocks.

In summary, in the present invention, an HARQ transmission block during a downlink signal transmission is obtained, wherein the transmission block comprises at least code block. The code block that cannot be correctly decoded is then stored into a divided storage space of a buffer, with the storage space of the buffer being dynamically divided in a unit of code blocks. Through the above method of dynamically dividing the storage space of the buffer in a unit of code blocks, the issue of correctly decoded code blocks occupying valuable storage spaces in a conventional solution of dividing the storage space in a unit of transmission blocks is prevented, thereby reducing the capacity required by the buffer while also enhancing utilization efficiency of the buffer.

The above and other aspects of the invention will become better understood with regard to the following detailed description of the preferred but non-limiting embodiments. The following description is made with reference to the accompanying drawings.

DETAILED DESCRIPTION OF THE INVENTION

The Long-Term Evolution (LTE) specifications define five types of user equipments. The number of soft bits that can be stored by the buffers of the five user equipments are as shown in Table-1.

TABLE 1

Number of soft bits that can be stored in buffers of user equipments

| Type of user equipment | Number of soft bits ($N_{soft}$) |
|---|---|
| Category 1 | 250368 |
| Category 2 | 1237248 |
| Category 3 | 1237248 |
| Category 4 | 1827072 |
| Category 5 | 3667200 |

In the LTE specifications, the size of the storage space and the number of transmission blocks that can be stored in the storage space required for storing each HARQ transmission block are as the equation below:

$$N_{IR} = \left\lfloor \frac{N_{soft}}{K_{MIMO} \cdot \min(M_{DL\_HARQ}, M_{limit})} \right\rfloor$$

In the above equation, $N_{IR}$ represents the size of the storage space of the HARQ buffer for each transmission; $N_{soft}$ is the size specified in Table-1, $K_{MIMO}$ represents a coefficient corresponding to the transmission mode, and equals 2 if the transmission mode is a space multiplexing transmission mode or equals 1 if the transmission mode is a transmission mode other than the space multiplexing transmission mode; $M_{limit}$ is a constant value 9, $M_{DL\_HARQ}$ is the maximum number of downlink HARQ processes, and is dependent on configurations of time-division double (TDD) uplink/downlink (UL/DL), as shown in Table-2.

TABLE 2

Relationship between TDD UL/DL configurations and $M_{DL\_HARQ}$

| TDD UL/DL configuration | $M_{DL\_HARQ}$ |
|---|---|
| 0 | 4 |
| 1 | 7 |
| 2 | 10 |
| 3 | 9 |
| 4 | 12 |
| 5 | 15 |
| 6 | 6 |

More specifically, the user equipment divides the storage space of the HARQ buffer into eight parts. In practice, when the TDD UL/DL configuration is 5, i.e., when the maximum number of the HARQ processes is 15, a situation of no available storage space for storing error codewords may occur.

Each transmission block in the LTE transmission includes 1 to 13 code blocks, each of which has a respective CRC for checking whether the corresponding code block is correctly decoded. Thus, in certain transmission blocks, it is possible that some code blocks are corrected decoded whereas others are incorrectly decoded. In an approach of designating the buffer according to transmission blocks, the correctly decoded code blocks also occupy valuable storage spaces.

To fully utilize the storage space of a buffer, in the present invention, the buffer is dynamically divided in a unit of code blocks, so as to significantly increase the utilization efficiency of the buffer.

Details of the embodiments of the present invention shall be described with the accompanying drawings below.

Figure 1:
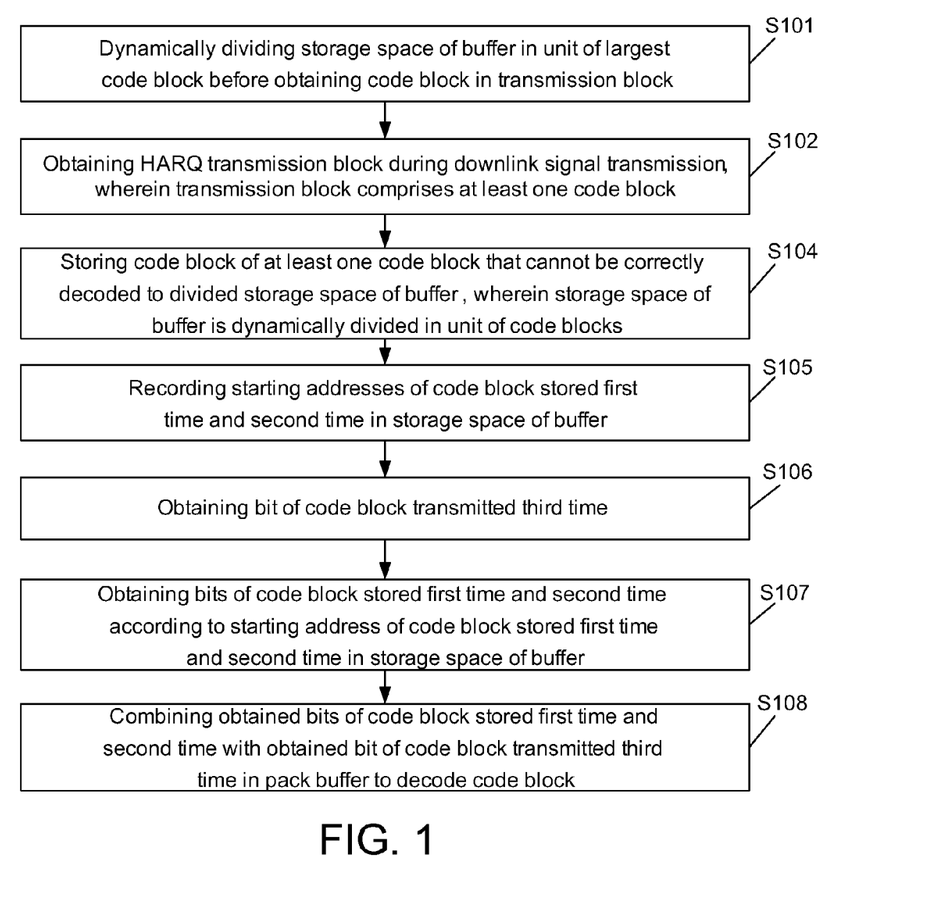
FIG. 1 is a flowchart of a method for storing an HARQ transmission block according to an embodiment of the present invention.
Figure 2:
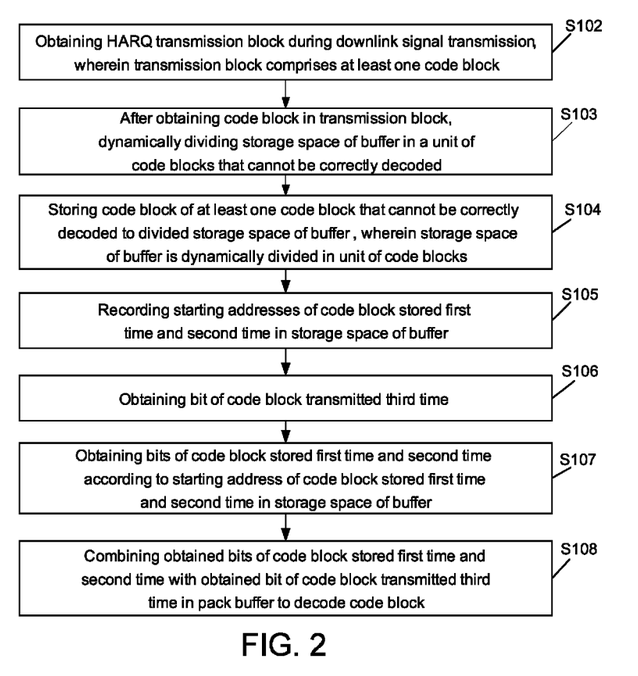
FIG. 2 is a flowchart of a method for storing an HARQ transmission block according to another embodiment of the present invention.

FIGS. 1 and 2 are flowcharts of a method for storing an HARQ transmission block according to an embodiment of the present invention. The method comprises the steps below.

If a storage space of a buffer is dynamically divided in a unit of code blocks before obtaining code blocks in a transmission block, the method comprises step S101 but not S103. If a storage space of a buffer is dynamically divided in a unit of code blocks after obtaining code blocks in a transmission block, the method comprises step S103 but not S101.

In step S101, before obtaining code blocks in a transmission block, a storage space of a buffer is dynamically divided in a unit of a largest code block. That is, before obtaining the code blocks in the transmission block, instead of utilizing a unit of transmission blocks, the storage space of the buffer is dynamically divided in a unit of the largest code block.

More specifically, in step S101, a first storage space of the buffer is divided and assigned to a system bit of each code block, and, according to communication environment conditions, it is determined whether to dynamically divide and assign a second storage space of the buffer to a verification bit of each code block. The size of the first storage space is the size of the largest code block. The verification bit comprises a first verification bit and a second verification bit.

In a communication system, a reception end requires the system bit, and the verification bit serves for only protection purposes. In a transmission end, the system bit is transmitted in the first HARQ transmission, and the verification bit is transmitted in a re-transmission. Decoding cannot be performed with only the verification bit, and so the reception end needs to combine the re-transmitted verification bit and the system bit transmitted in the first transmission to perform decoding.

Thus, the first storage space of the buffer is divided and assigned to the system bit of each code block, i.e., the storage space having the size of the largest code block is divided and assigned. Further, it is determined whether to dynamically divide and assign the second storage space of the buffer to the verification bit of each code block.

The second storage space dynamically changes. If communication channel conditions are satisfactory, the verification bit is not required. At this point, the size of the second storage bit may be 0. That is, the system bit of the code block is stored in the first storage space, and the buffered code block can then be deleted once it is detected that the code block is correctly decoded without further dividing and assigning the second storage space of the buffer to the verification bit of the code block. In contrast, a greater number of verification bits are preferred for inadequate communication channel conditions. At this point, the second storage space of the buffer is divided and assigned to the verification bit of the code block. In one situation, the size of the second storage space is twice of that of the first storage space, and the storage space of the first verification bit equals that of the second storage space, i.e., the storage spaces of the first verification bit and the second verification bit are equal to the size of the first storage space, respectively. As such, the first verification bit and the second verification bit both have sufficient storage spaces.

However, as the sizes of the code blocks of different transmission blocks may be different in actual transmissions, similar to the approach of $N_{IR}$, if the buffer is divided before obtaining the code blocks of the transmission block, the storage space divided and assigned to the code block also needs to be sufficient for storing the largest code block when dividing the buffer in a unit of code blocks. It should be noted that, if the storage space of the buffer is divided in a unit of the largest code block, the total number of code blocks storable in the buffer is less than the number of code blocks in the solution based on transmission blocks.

For example, assuming that a user equipment is Category 3, a total number of storable channel bits is 1237248, the TDD UL/DL configuration is 5, and $K_{mimo}$ is equal to 1. Thus, $N_{IR}$=154656, and so a total number of 8*13=104 code blocks can be stored. In the solution based on code blocks, the size of the storage space required by each code block is 3*6144=18432, and so 67 code blocks can be stored. Wherein, the size of each code block is 0 to 6144.

To solve the above problem, the size of the storage space for each code block needs to be reduced if the number of usable code blocks is to be increased. Thus, if the size of the second storage space is twice of that of the first storage space and the storage space of the first verification bit is equal to that of the second verification bit, the storage space for each code block can be reduced. In a preferred embodiment, the sizes of the first verification bit and the second verification bit are a half of the size of the first storage space, respectively.

Figure 3:
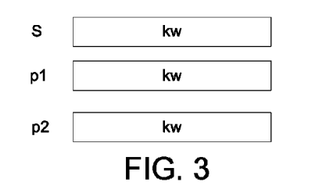
FIG. 3 is a schematic diagram of a storage space required by a conventional code block to be applied with a method for storing an HARQ transmission block according to an embodiment of the present invention.
Figure 4:
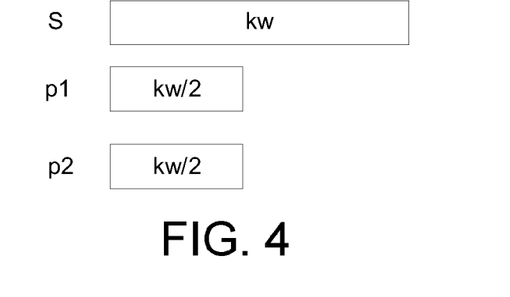
FIG. 4 is a schematic diagram of a storage space required by an optimized code block in a method for storing an HARQ transmission block according to an embodiment of the present invention.

Assuming that the size of each code block is KW, the storage space assigned by a conventional solution for buffering each code block is 3*KW, as shown in FIG. 3. The size of the storage space can actually be reduced. For example, as shown in FIG. 4, the size of the storage space for the system bit (S) is KW, whereas the sizes of the first and second verification bits (p1 and p2) are KW/2, respectively, i.e., the size of the second storage space is KW. As such, the size of the storage space for storing each code block in the buffer is 2*KW, with a ⅓ space reduction.

Figure 5:
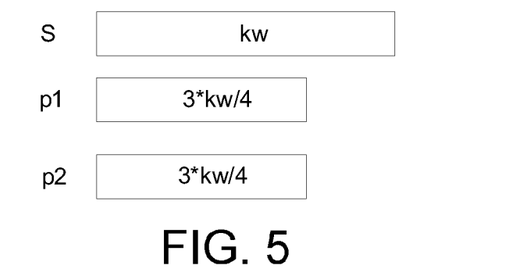
FIG. 5 is a schematic diagram of a storage space required by a conventional method with a limitation of speed matching to be applied with a method for storing an HARQ transmission block according to an embodiment of the present invention.
Figure 6:
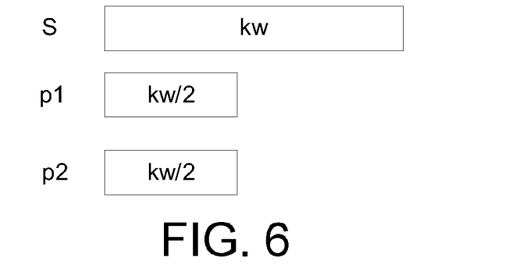
FIG. 6 is a schematic diagram of a storage space required by an optimized code block a limitation of speed matching in a method for storing an HARQ transmission block according to an embodiment of the present invention.

For another example, as shown in FIG. 5, assume that the storage size assigned to each code block is 2.5*KW due to a limitation of speed matching. The size of the storage space can also actually be reduced. For example, as shown in FIG. 6, for the system bit (S), the size of the storage space is KW, whereas the sizes of the first and second verification bits (p1 and p2) are KW/2, respectively, i.e., the size of the second storage space is KW. As such, the size of the storage space for storing each code block in the buffer is 2*KW, with a ⅕ space reduction.

In step S102, an HARQ transmission block during a downlink signal transmission is obtained. The transmission block comprises at least one code block.

A downlink signal refers to a signal that a base station transmits to a user equipment. The HARQ is a hybrid solution of Automatic Repeat Request (ARQ) and Froward Error Correction (FEC). Data communication is initially developed through wired networks, and generally requires a larger bandwidth and a higher transmission quality. For wired connections, the reliability of data transmission is realized through re-transmission. When a previous transmission attempt fails, re-transmitted data is requested to be divided—such transmission mechanism is referred to as ARQ. In a wireless transmission environment, the channel transmission quality may be degraded due to channel noises and attenuation caused by mobility as well as interferences from other users, and so data need to be divided into groups for protection and suppressing various interferences. Such protection is mainly achieved by FEC to transmit additional bits in the groups. However, excessive FEC may reduce transmission efficiency. Therefore, the HARQ technique combining the ARQ and the FEC is proposed. The HARQ technique satisfyingly compensates the effects brought by time variants of wireless mobile channels and multi-path attenuations upon signal transmission, and is one of the critical techniques future 3G LTE systems.

A transmission block usually comprises 1 to 13 code blocks, each of which has an own CRC code for checking whether the code block is corrected decoded, such that some code blocks in a transmission block are corrected decoded whereas others are incorrectly decoded.

In step S103, after obtaining the code blocks in the transmission block, the storage space of the buffer is dynamically divided in a unit of code blocks that cannot be correctly decoded. That is, after obtaining the code blocks in the transmission block, instead of utilizing a unit of transmission blocks, the storage space of the buffer is dynamically divided in a unit of code blocks that currently cannot be correctly decoded.

More specifically, in step S103, the first storage space of the buffer is divided and assigned to the system bit of each code block that currently cannot be correctly decoded, and, according to the communication environment, it is determined whether to dynamically divide and assign the second storage space of the buffer to the verification bit of each code block that currently cannot be correctly decoded. The size of the first storage space is equal to the size of the code blocks that currently cannot be correctly decoded. The verification bit comprises the first verification bit and the second verification bit.

If communication channel conditions are inadequate, a greater number of verification bits are preferred. At this point, the second storage space of the buffer is divided and assigned to the verification bit of the code block. In one situation, the size of the second storage space is twice of that of the first storage space, and the storage space of the first verification bit is equal to that of the second storage space, i.e., the storage spaces of the first verification bit and the second verification bit are equal to the size of the first storage space, respectively. As such, the first verification bit and the second verification bit both have sufficient storage spaces. In another situation, the size of the second storage space is smaller than twice of that of the first storage space, and the storage space of the first verification bit is equal to that of the second verification bit. In a preferred embodiment, the sizes of the first and second verification bits are a half of the size of the first storage space, respectively.

Variations and modifications for dynamically dividing the storage space of the buffer in a unit of code blocks in other embodiments can be easily appreciated by a person having ordinary skill in the art, and shall be omitted herein.

In step S104, the code block of the at least one code block that cannot be correctly decoded is stored into the divided storage space of the buffer. The storage space of the buffer is dynamically divided in a unit of code blocks. That is, the code block in the transmission block that cannot be correctly decoded is stored to the divided storage block of the buffer.

Due a limited number of re-transmission, the bit of the code block that cannot be correctly decoded from the first reception and the bit of the code block from the second reception are stored into the storage space of the buffer. The bit of the code block from the third reception, rather than storing to the storage space of the buffer when received, is directly combined with the bits of the code from the first and second receptions (the system bit, the first verification bit and/or the second verification bit) in a pack buffer for further decoding.

In step S105, starting addresses of the code block stored the first time and the second time in the storage space of the buffer are recorded.

The first transmission from the transmission end comprises all system bits of the code block, and the bits included in subsequent transmissions are determined according to actual circumstances. For example, the first verification bit of the code block is transmitted in the second transmission, and the second verification bit is transmitted in the third transmission. Alternatively, a part of the first verification bit and a part of the second verification bit are transmitted in the second transmission, and a part of the first verification bit and a part of the second verification bit are transmitted in the third transmission. The bits transmitted by the first and second transmissions are stored in the storage space of the buffer at the reception end, and correspond to the bits of the code block stored the first time and the second time in the storage space of the buffer.

If the size of the second storage space is smaller than twice of the size of the first storage space, the starting addresses of the code block stored or the first time and the second time in the storage space of the buffer are recorded to facilitate subsequent processes of combining, decoding and speed matching.

In step S106, the bit of the code block from the third transmission is obtained. That is, when the transmission end transmits the bit of the code block for the third time, the reception end obtains the bit of the code block that is transmitted for the third time.

In step S107, the bits of the code block stored the first time and the second time are obtained according to the recorded starting addresses of the code block stored the first time and the second time in the storage space of the buffer. That is, according to the recorded starting addresses of the bit stored the first time and the second time in the storage space of the buffer, the bits of the code block stored the first time and the second time are obtained.

In step S108, the obtained bits of the code block stored the first time and the second time and the obtained bit of the code block transmitted the third time are combined in the pack buffer to decode the code block.

A pack buffer is a dynamic buffer utilized by the current data block, and is an independent buffer from the abovementioned buffer. The obtained bits of the code stored the first time and the second time and the obtained bit of the code transmitted the third time are combined in the pack buffer to decode the code block.

Figure 7:
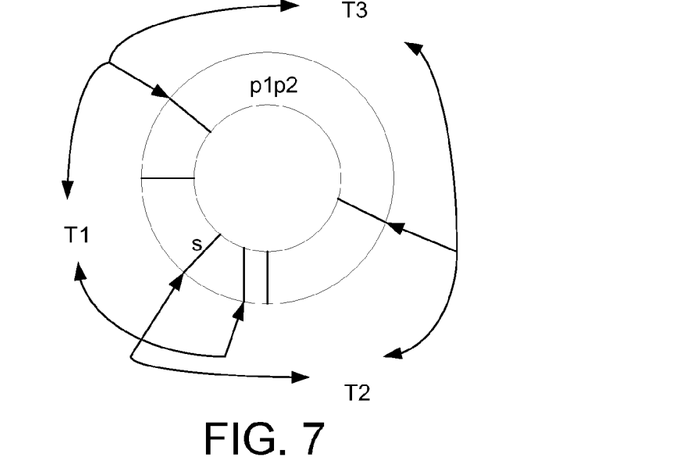
FIG. 7 is a schematic diagram of a transmission for bits of a transmission code block from a memory of a transmission end.
Figure 8:
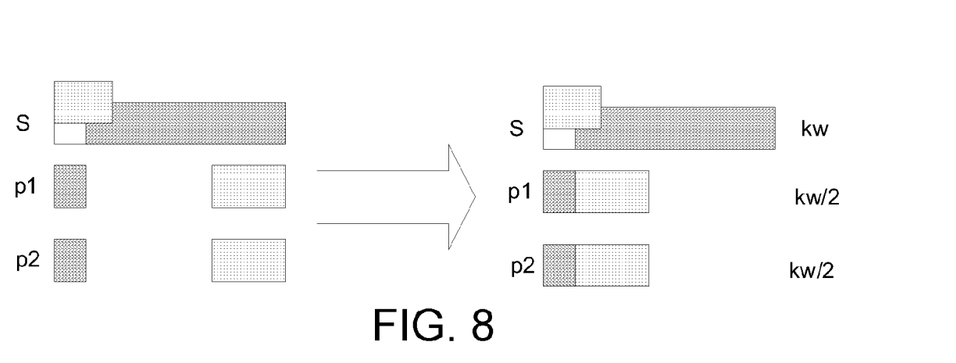
FIG. 8 is a schematic diagram of a buffer having stored two times in a method for storing an HARQ transmission block according to an embodiment of the present invention.
Figure 9:
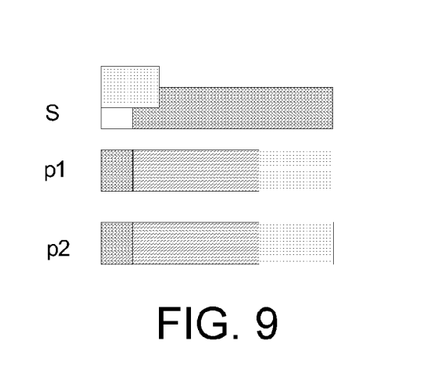
FIG. 9 is a schematic diagram of a combination situation in a pack buffer in a method for storing an HARQ transmission block according to an embodiment of the present invention.

FIG. 7 shows a schematic diagram of a transmission of a bit of a code transmitted from a buffer of the transmission end when the code is transmitted for three times. As shown in FIG. 7, the first transmission T1 comprises the system bit of the code block, and subsequent transmission may include contents determined according to actual circumstances. FIG. 8 shows a buffer in a user equipment after a reception end stores for two times. In FIG. 8, blank frames are bits stored the first time, and shaded frames are bits stored the second time. In the above second transmission, assuming that RV=3, a corresponding position in the buffer is expectedly at a rear section in FIG. 8. However, it is to be noted that, the storage space divided and assigned to the first verification bit and the second verification bit is only KW/2. Thus, the positions of the bits stored the first two times need to be relocated to a front section, and the corresponding starting addresses of the bits stored in the first two times are recorded, so as to facility the future combination of the bits and speed matching. FIG. 9 shows a combination situation in a pack buffer in a third transmission. Referring to FIG. 9, although the buffer is not assigned with a 3*KW storage space, no bits are discarded as thus no performance loss is resulted.

Figure 10:
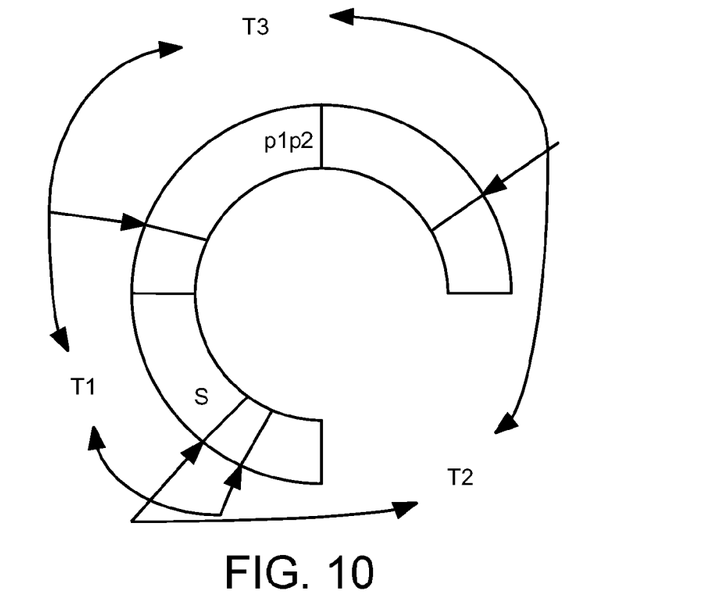
FIG. 10 is a schematic diagram of a transmission of bits of a code block from a buffer of a transmission end with a limitation of speed matching.
Figure 11:
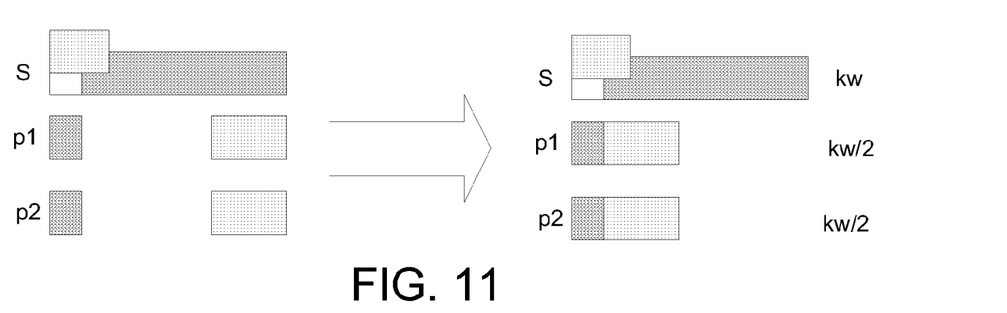
FIG. 11 is a schematic diagram of a storage situation of a buffer having stored two times with a limitation of speed matching in a method for storing an HARQ transmission block according to an embodiment of the present invention.
Figure 12:
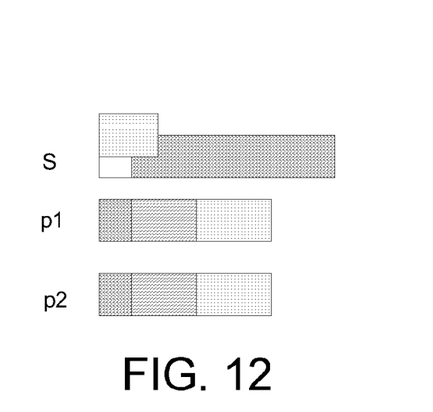
FIG. 12 is a schematic diagram of a combination situation in a pack buffer with a limitation of speed matching in a method for storing an HARQ transmission block according to an embodiment of the present invention.

FIG. 10 shows a schematic diagram of a transmission of a bit of a code transmitted from a buffer of the transmission end when the code is transmitted for three times with a limitation of speed matching. As shown in FIG. 10, the first transmission T1 comprises all the system bits of the code block, and subsequent transmission may include contents determined according to actual circumstances. FIG. 11 shows a buffer in a user equipment after a reception end stores for two times. In FIG. 11, blank frames are bits stored the first time, and shaded frames are bits stored the second time. In the above second transmission, assuming that RV=3, a corresponding position in the buffer is expectedly at a rear section in FIG. 11. However, it is to be noted that, the storage space divided and assigned to the first verification bit and the second verification bit is only KW/2. Thus, the positions of the bits stored the first two times need to be relocated to a front section, and the corresponding starting addresses of the bits stored in the first two times are recorded, so as to facility the future combination of the bits and speed matching. Referring to the combination situation in the pack buffer during the third transmission as shown in FIG. 12, although the buffer is not assigned with a 2.5*KW storage space, no bits are discarded and thus no performance loss is resulted.

Figure 13:
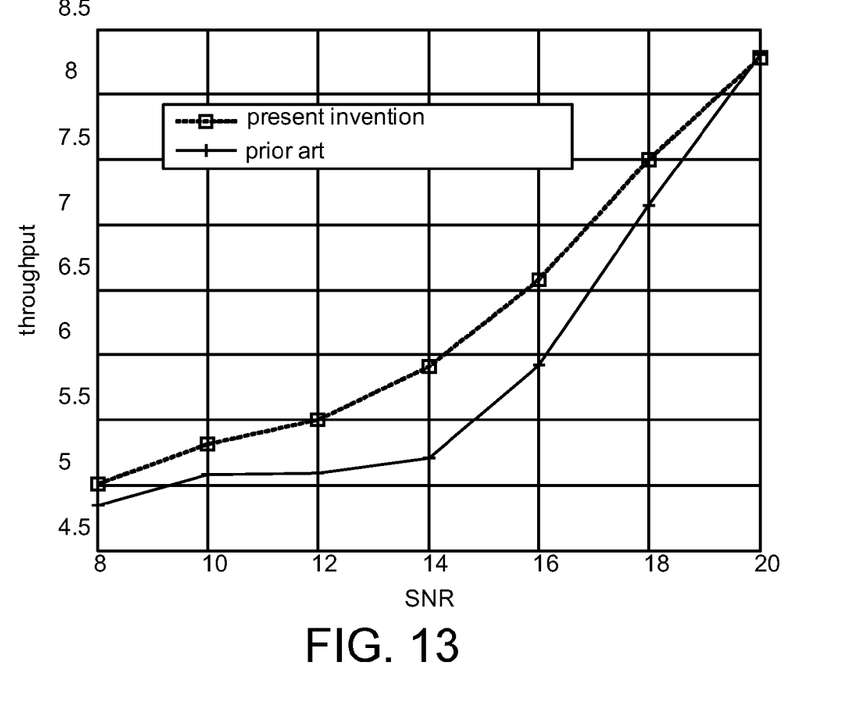
FIG. 13 is a schematic diagram of comparing a method for storing an HARQ transmission block of the present invention with the prior art.

FIG. 13 shows a schematic diagram of comparing a method for storing an HARQ transmission block of the present invention with a technique of the prior art. Assume that a user equipment is Category 3, the channel type is EVA70, the TDD UL/DL configuration is 5, a modem is modulated by 16 QAM with one transmission and two reception antennas, and a coding rate is 0.93. As such, the size of a transmission block is {25456, 0, 0, 25456, 25456, 0, 0, 25456, 25456, 25456}. With the same-sized buffer utilized by both the present invention and the conventional technique, it is clearly observed from FIG. 13 that the throughput of the present invention is remarkably increased.

In summary, in the present invention, an HARQ transmission block during a downlink signal transmission is obtained, wherein the transmission block comprises at least code block. The code block that cannot be correctly decoded is then stored into a divided storage space of a buffer, with the storage space of the buffer being dynamically divided in a unit of code blocks. Through the above method of dynamically dividing the storage space of the buffer in a unit of code blocks, the issue of correctly decoded code blocks occupying valuable storage spaces in a conventional solution of dividing the storage space in a unit of transmission blocks is prevented, thereby reducing the capacity required by the buffer while also enhancing utilization efficiency of the buffer.

Figure 14:
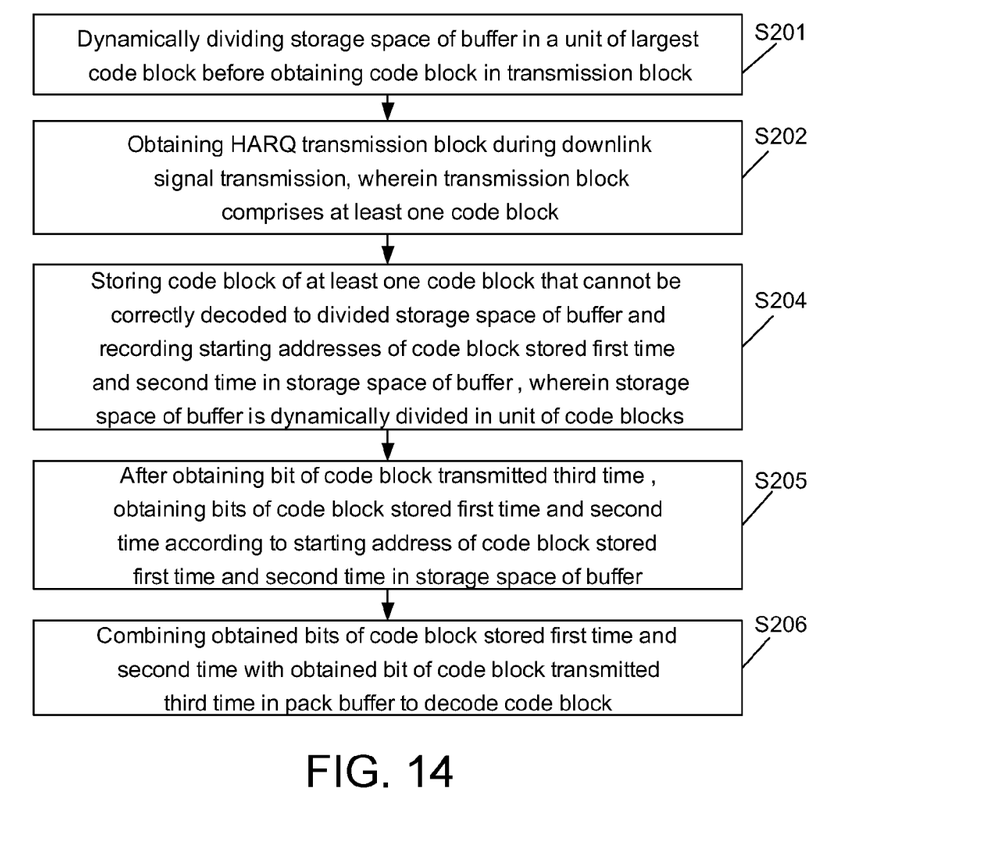
FIG. 14 is a flowchart of a method for decoding an HARQ transmission block according to an embodiment of the present invention.
Figure 15:
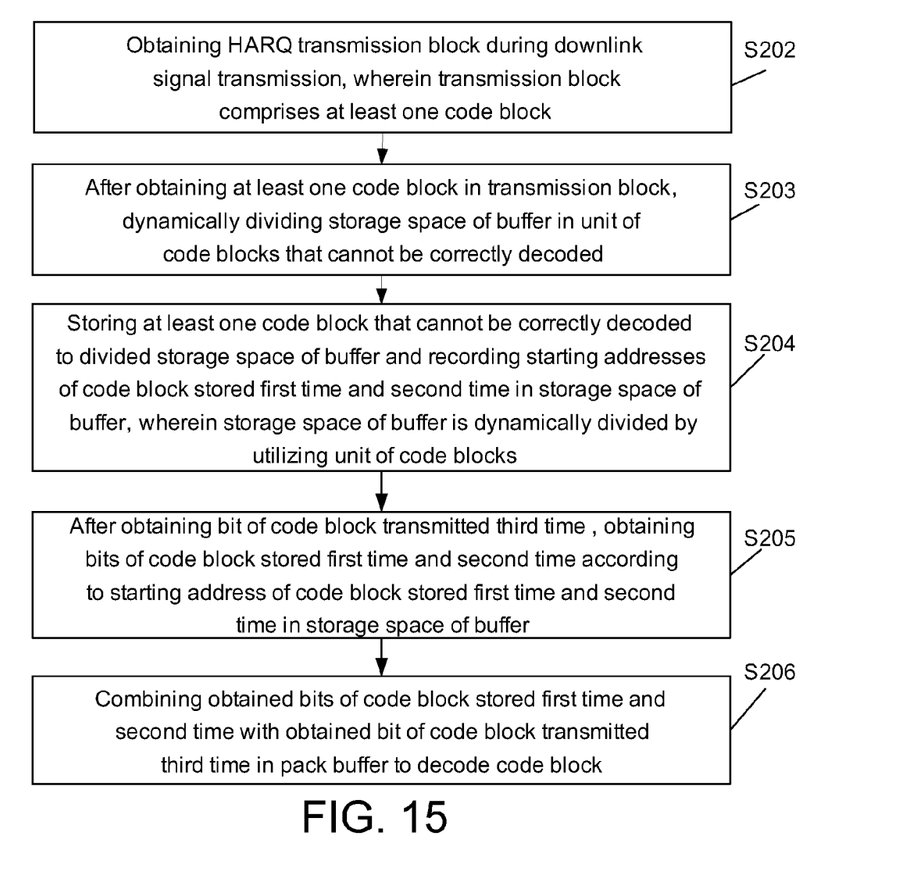
FIG. 15 is a flowchart of a method for decoding an HARQ transmission block according to another embodiment of the present invention.

FIGS. 14 and 15 are a flowchart of a method for decoding an HARQ transmission block. The method comprises the steps below.

If a storage space of a buffer is dynamically divided in a unit of code blocks before obtaining code blocks in a transmission block, the method comprises step S201 but not S203. If a storage space of a buffer is dynamically divided in a unit of code blocks after obtaining code blocks in a transmission block, the method comprises step S203 but not S201.

In step S201, before obtaining code blocks in a transmission block, a storage space of a buffer is dynamically divided in a unit of a largest code block. That is, before obtaining the code blocks in the transmission block, instead of utilizing a unit of transmission blocks, the storage space of the buffer is dynamically divided in a unit of the largest code block.

More specifically, in step S201, a first storage space of the buffer is divided and assigned to a system bit of each code block, and, according to communication environment conditions, it is determined whether to dynamically divide and assign a second storage space of the buffer to a verification bit of each code block. The size of the first storage space is the size of the largest code block. The verification bit comprises a first verification bit and a second verification bit.

In step S202, an HARQ transmission block during a downlink signal transmission is obtained. The transmission block comprises at least one code block.

A transmission block usually comprises 1 to 13 code blocks, each of which has an own CRC code for checking whether the code block is corrected decoded, such that some code blocks in a transmission block are corrected decoded whereas others are incorrectly decoded.

In step S203, after obtaining the at least one code block in the transmission block, the storage space of the buffer is dynamically divided in a unit of code blocks that cannot be correctly decoded. That is, after obtaining the code blocks in the transmission block, instead of utilizing a unit of transmission blocks, the storage space of the buffer is dynamically divided in a unit of code blocks that currently cannot be correctly decode.

More specifically, in step S203, the first storage space of the buffer is divided and assigned to the system bit of each code block that currently cannot be correctly decoded, and, according to the communication environment, it is determined whether to dynamically divided and assign the second storage space of the buffer to the verification bit of each code block that currently cannot be correctly decoded. The size of the first storage space is the size of the code blocks that currently cannot be correctly decoded. The verification bit comprises the first verification bit and the second verification bit.

In step S204, the code block of the at least one code block that cannot be correctly decoded is stored into the divided storage space of the buffer. The storage space of the buffer is dynamically divided in a unit of code blocks. That is, the code blocks in the transmission block that cannot be correctly decoded are stored to the divided storage block of the buffer.

If the size of the second storage space is smaller than twice of the size of the first storage space, the starting addresses of the code block stored the first time and the second time in the storage space of the buffer are recorded to facilitate subsequent processes of combining, decoding and speed matching.

In step S205, after obtaining the bit of the code transmitted the third time, the bits of the code block stored from the first time and the second time are obtained according to the recorded starting addresses of the code block stored the first time and the second time in the storage space of the buffer.

In step S206, the obtained bits of the code block stored the first time and the second time and the obtained bit of the code block transmitted the third time are combined in a pack buffer to decode the code block.

In the present invention, an HARQ transmission block during a downlink signal transmission is obtained, wherein the transmission block comprises at least code block. The code block that cannot be correctly decoded is then stored into a storage space of a divided buffer, with the storage space of the buffer being dynamically divided in a unit of code blocks. According to the recorded starting addresses of the code blocks in the buffer, the previously stored bits of the code block are obtained and combined with the obtained bit from the third transmission, and decoding is performed in a pack buffer. Through the above method of dynamically dividing the storage space of the buffer in a unit of code blocks, the issue of correctly decoded code blocks occupying valuable storage spaces in a conventional solution of dividing the storage space in a unit of transmission blocks is prevented, thereby reducing the capacity required by the buffer while also enhancing utilization efficiency of the buffer. Further, no bits are discarded and thus no performance loss is resulted.

Figure 16:
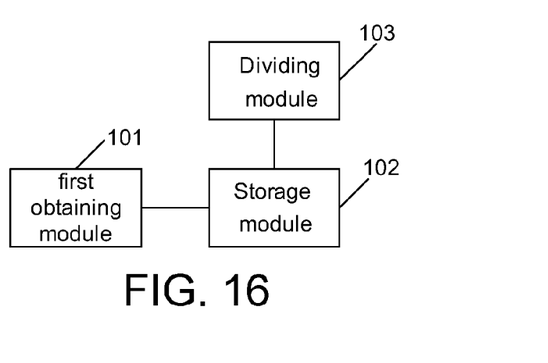
FIG. 16 is a block diagram of a device for storing an HARQ transmission block according to another embodiment of the present invention.

FIG. 16 shows a block diagram of a device for storing an HARQ transmission block according to an embodiment of the present invention. The device comprises a first obtaining module 101, a storage module 102 and a dividing module 103.

The first obtaining module 101 obtains an HARQ transmission block during a downlink signal transmission, wherein the transmission block comprises at least one code block.

The storage block 102 stores the code block of the at least one code block that cannot be correctly decoded into a storage space of a buffer. The storage space of the buffer is dynamically divided in a unit of code blocks.

The dividing module 103 divides the storage space of the buffer in a unit of code blocks. More specifically, the dividing module 103 divides and assigns a first storage space of the buffer to a system bit of each code block, and determines whether to dynamically divide and assign a second storage space of the buffer to a verification bit of each code block according to communication environment conditions.

The size of the first storage space is the size of the largest code block. The verification bit comprises a first verification bit and a second verification bit.

The size of the second storage space is twice of that of the first storage space, and the storage space of the first verification bit is equal to that of the second storage space.

The sizes of the first verification bit and the second verification bit are a half of the size of the first storage space, respectively.

The device further comprises a recording module, a second obtaining module, a third obtaining module and a combining module.

The recording module records the starting address of the code stored the first time and the second time in the storage space of the buffer.

The second obtaining module obtains a bit of the code block transmitted the third time.

The third obtaining module obtains the bits of the code stored the first time and the second time according to the recorded starting addresses of the code block stored the first time and the second time.

The combining module combines the obtained bits of the code block stored the first time and the second time with the obtained bit of the code block transmitted the third time to decode the code block.

In the present invention, in an HARQ transmission block during a downlink signal transmission, a code block that cannot be correctly decoded is stored into a divided storage space of a buffer, with the storage space of the buffer being dynamically divided in a unit of code blocks. According to the recorded starting addresses of the code blocks in the buffer, the previously stored bits of the code block are obtained and combined with the obtained bit from the third transmission, and decoding is performed in a pack buffer. Through the above method of dynamically dividing the storage space of the buffer in a unit of code blocks, the issue of correctly decoded code blocks occupying valuable storage spaces in a conventional solution of dividing the storage space in a unit of transmission blocks is prevented, thereby reducing the capacity required by the buffer while also enhancing utilization efficiency of the buffer.

Figure 17:
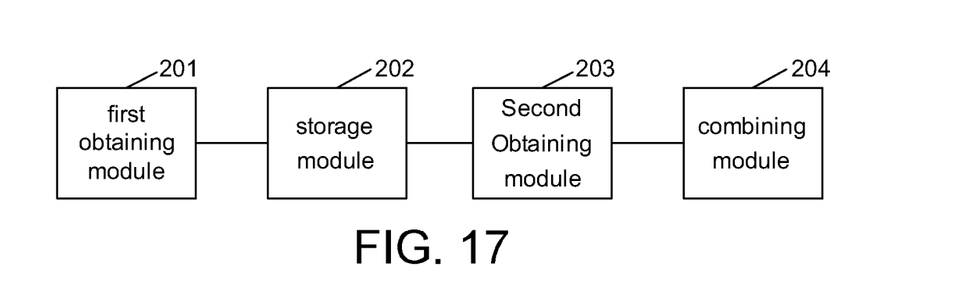
FIG. 17 is a block diagram of a device for decoding an HARQ transmission block according to another embodiment of the present invention.

FIG. 17 shows a block diagram of a device for decoding an HARQ transmission block. The device comprises a first obtaining module 201, a storage module 202, a second obtaining module 203 and a combining module 204.

The first obtaining module 201 obtains an HARQ transmission block during a downlink signal transmission, wherein the transmission block comprises at least one code block.

The storage module 202 stores the code block of the at least one code block that cannot be correctly decoded into a divided storage space of a buffer, and records starting addresses of the code block stored the first time and the second time in the storage space of the buffer. The storage space of the buffer is dynamically divided in a unit of code blocks.

After obtaining a bit of the code block transmitted the third time, the second obtaining module 203 obtains bits of the code block stored the first time and the second time according to the recorded starting addresses of the code block stored the first time and the second time in the storage space of the buffer.

The combining module 204 combines the obtained bits of the code block stored the first time and the second time with the obtained bit of the code block transmitted in the third time to decode the code block.

In the present invention, an HARQ transmission block during a downlink signal transmission is obtained, wherein the transmission block comprises at least code block. The code block that cannot be correctly decoded is then stored into a divided storage space of a buffer, with the storage space of the buffer being dynamically divided in a unit of code blocks. According to the recorded starting addresses of the code blocks in the buffer, the previously stored bits of the code block are obtained and combined with the obtained bit from the third transmission, and decoding is performed in a pack buffer. Through the above method of dynamically dividing the storage space of the buffer in a unit of code blocks, the issue of correctly decoded code blocks occupying valuable storage spaces in a conventional solution of dividing the storage space in a unit of transmission blocks is prevented, thereby reducing the capacity required by the buffer while also enhancing utilization efficiency of the buffer. Further, no bits are discarded and thus no performance loss is resulted.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for storing a hybrid automatic repeat request (HARQ) transmission block, comprising:
   obtaining the HARQ transmission block during a downlink signal transmission, wherein the transmission block comprises at least one code block;
   storing the code block of the at least one code block that cannot be correctly decoded to a divided storage space of a buffer, wherein the storage space of the buffer is dynamically divided in a unit of code blocks;
   recording starting addresses of the code block stored during a first time and during a second time in the storage space of the buffer, respectively;
   obtaining a bit of the code block transmitted during a third time;
   obtaining bits of the code block stored during the first time and during the second time according to the recorded starting addresses of the code block stored during the first time and the second time in the storage space of the buffer, respectively; and
   combining the obtained bits of the code block stored during the first time and during the second time with the obtained bit of the code block transmitted during the third time in a pack buffer to decode the code block;
   wherein, when the storage space of the buffer is dynamically divided in a unit of code blocks before obtaining the at least one code block, the storage space of the buffer is dynamically divided in a unit of a largest code block; and
   wherein, when the storage space of the buffer is dynamically divided in a unit of code blocks after obtaining the at least one code block, the storage space of the buffer is dynamically divided in a unit of a code block that cannot be correctly decoded.

2. The method according to claim 1, wherein the step of dynamically dividing the storage space of the buffer in the unit of code blocks comprises:
   dividing and assigning a first storage block of the buffer to a system bit of each code block, and determining whether to divide and assign a second storage space of the buffer to a verification bit of each code block according to communication environment conditions.

3. The method according to claim 2, wherein a size of the first storage space is a size of the code block, and the verification bit comprises a first verification bit and a second verification bit.

4. The method according to claim 3, wherein a size of the second storage space is twice of the size of the first storage space, and storage spaces of the first verification bit and the second verification bit are equal.

5. The method according to claim 4, further comprising:
   recording starting addresses of the code block stored during a first time and during a second time in the storage space of the buffer, respectively;
   obtaining a bit of the code block transmitted during a third time;
   obtaining bits of the code block stored during the first time and during the second time according to the recorded starting addresses of the code block stored during the first time and during the second time in the storage space of the buffer, respectively; and combining the obtained bits of the code block stored during the first time and during the second time with the obtained bit of the code block transmitted during the third time in a pack buffer to decode the code block.

6. The method according to claim 3, wherein a size of the second storage space is smaller than twice of the size of the first storage space, and storage spaces of the first verification bit and the second verification bit are equal.

7. The method according to claim 6, wherein sizes of the storages spaces of the first verification bit and the second verification bit are a half of the size of the first storage space, respectively.

8. The method according to claim 7, further comprising:
recording starting addresses of the code block stored during a first time and during a second time in the storage space of the buffer, respectively;
obtaining a bit of the code block transmitted during a third time;
obtaining bits of the code block stored during the first time and during the second time according to the recorded starting addresses of the code block stored during the first time and during the second time in the storage space of the buffer, respectively; and
combining the obtained bits of the code block stored during the first time and during the second time with the obtained bit of the code block transmitted during the third time in a pack buffer to decode the code block.

9. The method according to claim 6, further comprising:
recording starting addresses of the code block stored during a first time and during a second time in the storage space of the buffer, respectively;
obtaining a bit of the code block transmitted during a third time;
obtaining bits of the code block stored during the first time and during the second time according to the recorded starting addresses of the code block stored during the first time and during the second time in the storage space of the buffer, respectively; and
combining the obtained bits of the code block stored during the first time and during the second time with the obtained bit of the code block transmitted during the third time in a pack buffer to decode the code block.

10. The method according to claim 3, further comprising:
recording starting addresses of the code block stored during a first time and during a second time in the storage space of the buffer, respectively;
obtaining a bit of the code block transmitted during a third time;
obtaining bits of the code block stored during the first time and during the second time according to the recorded starting addresses of the code block stored during the first time and during the second time in the storage space of the buffer, respectively; and
combining the obtained bits of the code block stored during the first time and during the second time with the obtained bit of the code block transmitted during the third time in a pack buffer to decode the code block.

11. The method according to claim 2, further comprising:
recording starting addresses of the code block stored during a first time and during a second time in the storage space of the buffer, respectively;
obtaining a bit of the code block transmitted during a third time;
obtaining bits of the code block stored during the first time and during the second time according to the recorded starting addresses of the code block stored during the first time and during the second time in the storage space of the buffer, respectively; and combining the obtained bits of the code block stored during the first time and during the second time with the obtained bit of the code block transmitted during the third time in a pack buffer to decode the code block.

12. A method for decoding an HARQ transmission block, comprising:
obtaining the HARQ transmission block during a downlink signal transmission, wherein the transmission block comprises at least one code block;
storing the code block of the at least one code block that cannot be correctly decoded to a divided storage space of a buffer;
recording starting addresses of bits of the code block stored during a first time and during a second time in the storage space of the buffer, respectively, wherein the storage space of the buffer is dynamically divided in a unit of code blocks;
after obtaining a bit of the code block transmitted during a third time, obtaining the bits of the code block stored during the first time and during the second time according to the recorded starting addresses of the code block stored during the first time and during the second time in the storage space of the buffer, respectively; and
combining the obtained bits of the code block stored during the first time and during the second time with the obtained bit of the code block transmitted during the third time in a pack buffer to decode the code block;
wherein, when the storage space of the buffer is dynamically divided in a unit of code blocks before obtaining the at least one code block, the storage space of the buffer is dynamically divided in a unit of a largest code block; and
wherein, when the storage space of the buffer is dynamically divided in a unit of code blocks after obtaining the at least one code block, the storage space of the buffer is dynamically divided in a unit of a code block that cannot be correctly decoded.

13. A device for storing an HARQ transmission block, comprising:
a first obtaining module, for obtaining the HARQ transmission block during a downlink signal transmission, wherein the transmission block comprises at least one code block;
a storage module, for storing the code block of the at least one code block that cannot be correctly decoded to a divided storage space of a buffer, wherein the storage space of the buffer is dynamically divided in a unit of code blocks:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted during the third time in a pack buffer to decode the code block;

wherein, when the storage space of the buffer is dynamically divided in a unit of code blocks before obtaining the at least one code block, the storage space of the buffer is dynamically divided in a unit of a largest code block; and wherein, when the storage space of the buffer is dynamically divided in a unit of code blocks after obtaining the at least one code block, the storage space of the buffer is dynamically divided in a unit of a code block that cannot be correctly decoded.

14. The device according to claim 13, further comprising:
a dividing module, for dynamically dividing the storage space of the buffer in the unit of code blocks.

15. The device according to claim 14, wherein the dividing module divides and assigns a first storage block of the buffer to a system bit of each code block, and determines whether to divide and assign a second storage space of the buffer to a verification bit of each code block according to communication environment conditions.

16. The device according to claim 15, wherein a size of the first storage space is a size of the code block, and the verification bit comprises a first verification bit and a second verification bit.

17. The device according to claim 16, wherein a size of the second storage space is twice of the size of the first storage space, and storage spaces of the first verification bit and the second verification bit are equal.

18. The device according to claim 17, further comprising:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted during the third time in a pack buffer to decode the code block.

19. The device according to claim 16, wherein a size of the second storage space is smaller than twice of the size of the first storage space, and storage spaces of the first verification bit and the second verification bit are equal.

20. The device according to claim 19, wherein sizes of the storages spaces of the first verification bit and the second verification bit are a half of the size of the first storage space, respectively.

21. The device according to claim 20, further comprising:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted during the third time in a pack buffer to decode the code block.

22. The device according to claim 19, further comprising:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted during the third time in a pack buffer to decode the code block.

23. The device according to claim 16, further comprising:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted during the third time in a pack buffer to decode the code block.

24. The device according to claim 15, further comprising:
a recording module, for recording the starting addresses of the code block stored during the first time and during the second time in the storage space of the buffer, respectively;
a second obtaining module, for obtaining the bit of the code block transmitted during the third time;
a third obtaining module, for obtaining the bits of the code block stored during the first time and during the second time according to the recorded starting addresses of the code block stored during the first time and during the second time in the storage space of the buffer, respectively; and
a combining module, for combining the obtained bits of the code block stored during the first time and during the second time with the obtained bit of the code block transmitted the third time in a pack buffer to decode the code block.

25. The device according to claim 14, further comprising:
a recording module, for recording the starting addresses of the code block stored during the first time and during the second time in the storage space of the buffer, respectively;

a second obtaining module, for obtaining the bit of the code block transmitted during the third time;

a third obtaining module, for obtaining the bits of the code block stored during the first time and during the second time according to the recorded starting addresses of the code block stored during the first time and during the second time in the storage space of the buffer, respectively; and a combining module, for combining the obtained bits of the code block stored during the first time and during the second time with the obtained bit of the code block transmitted during the third time in a pack buffer to decode the code block.

* * * * *